(12) United States Patent
Takahashi

(10) Patent No.: US 9,318,562 B2
(45) Date of Patent: Apr. 19, 2016

(54) SEMICONDUCTOR APPARATUS WITH BAND ENERGY ALIGNMENTS

(75) Inventor: Tsuyoshi Takahashi, Ebina (JP)

(73) Assignee: FUJITSU LIMITED, Kawasaki (JP)

( * ) Notice: Subject to any disclaimer, the term of this patent is extended or adjusted under 35 U.S.C. 154(b) by 130 days.

(21) Appl. No.: 13/533,033

(22) Filed: Jun. 26, 2012

(65) Prior Publication Data

US 2013/0032856 A1 Feb. 7, 2013

(30) Foreign Application Priority Data

Aug. 1, 2011 (JP) .................. 2011-168782

(51) Int. Cl.
| | | |
|---|---|---|
| H01L 31/06 | (2012.01) | |
| H01L 29/267 | (2006.01) | |
| H01L 29/66 | (2006.01) | |
| H01L 29/88 | (2006.01) | |

(52) U.S. Cl.
CPC ........ *H01L 29/267* (2013.01); *H01L 29/66219* (2013.01); *H01L 29/882* (2013.01)

(58) Field of Classification Search
CPC .................. H01L 29/66219; H01L 29/882
USPC .................. 257/104, 190, 183, 197, 201
See application file for complete search history.

(56) References Cited

U.S. PATENT DOCUMENTS

| | | | | |
|---|---|---|---|---|
| 3,225,272 A | * | 12/1965 | Cronemeyer | 257/44 |
| 3,358,158 A | * | 12/1967 | Tiemann | 257/104 |
| 4,395,722 A | * | 7/1983 | Esaki et al. | 257/191 |
| 5,021,863 A | * | 6/1991 | Yokoyama et al. | 257/585 |
| 2010/0248676 A1 | * | 9/2010 | Takahashi | 455/341 |

FOREIGN PATENT DOCUMENTS

| | | |
|---|---|---|
| JP | 62-128559 A | 6/1987 |
| JP | 5-48076 | 2/1993 |

OTHER PUBLICATIONS

Japanese Office Action, for the Corresponding JP Application No. 2011-168782, mailed on Jan. 13, 2015, with partial translation.

* cited by examiner

*Primary Examiner* — Jay C Kim
(74) *Attorney, Agent, or Firm* — Kratz, Quintos & Hanson, LLP

(57) ABSTRACT

A semiconductor apparatus includes: a semiconductor apparatus includes: a first semiconductor layer of a first conductivity type; a second semiconductor layer of a second conductivity type; and a third semiconductor layer of the first conductivity type, wherein: the second semiconductor layer is formed between the first and third semiconductor layers, and the first and second semiconductor layers are in contact with each other; and a first energy level at a bottom edge of a conduction band of the first semiconductor layer is lower than a second energy level at a top edge of a valence band of the second semiconductor layer, and the second energy level at the top edge of the valence band of the second semiconductor layer is substantially the same as a third energy level at a bottom edge of a conduction band of the third semiconductor layer.

8 Claims, 21 Drawing Sheets

DOWN CONVERSION

UP CONVERSION

US 9,318,562 B2

SEMICONDUCTOR APPARATUS WITH BAND ENERGY ALIGNMENTS

CROSS-REFERENCE TO RELATED APPLICATION

This application is based upon and claims the benefit of priority of the prior Japanese Patent Application No. 2011-168782, filed on Aug. 1, 2011, the entire contents of which are incorporated herein by reference.

FIELD

The embodiments discussed herein are related to a semiconductor apparatus.

BACKGROUND

In semiconductor apparatuses, such as electronic devices, the application of a technology related to terahertz waves is desirable. In order to generate terahertz waves, the oscillation wavelength may be increased by using a quantum cascade laser, or the operation frequency may be increased in an electronic device. Electronic devices capable of handling such high frequencies include Esaki diodes and resonant tunneling diodes (RTDs).

An Esaki diode utilizes the interband quantum tunneling, and is formed of, for example, a pn junction of p$^+$-InGaAs 511 and n$^+$-InGaAs 512, which are heavily doped with an impurity, as illustrated in FIG. 1A. With this structure, when a voltage is applied, as illustrated in FIG. 1B, a current increases at first since electrons flow through a thin junction portion due to quantum tunneling, however, as the voltage increases, the flow of electrons is gradually blocked and the diode exhibits a property of having a negative resistance.

An RTD is formed, as illustrated in FIG. 2A, for example, such that i-InAlAs 523, i-InGaAs 524, and i-InAlAs 525, which are not doped with impurities, are formed between two compounds, n-InGaAs 521 and 522. The compounds i-InAlAs 523 and 525 are made of a material having a wider bandgap than the n-InGaAs 521 and 522. In the RTD, a quantum level is formed in the i-InGaAs layer 524. With this structure, as illustrated in FIG. 2B, when a given voltage is applied, a large current flows, however, as the voltage increases, the RTD exhibits a property of having a negative resistance.

Since the Esaki diode and the RTD exhibit a property of having a negative resistance as described above, they may be used in oscillators.

An example of the above-described related art is disclosed in Japanese Laid-open Patent Publication No. 5-48076.

SUMMARY

According to an aspect of the embodiments, a semiconductor apparatus includes: a first semiconductor layer of a first conductivity type; a second semiconductor layer of a second conductivity type; and a third semiconductor layer of the first conductivity type, wherein: the second semiconductor layer is formed between the first and third semiconductor layers, and the first and second semiconductor layers are in contact with each other; and a first energy level at a bottom edge of a conduction band of the first semiconductor layer is lower than a second energy level at a top edge of a valence band of the second semiconductor layer, and the second energy level at the top edge of the valence band of the second semiconductor layer is substantially the same as a third energy level at a bottom edge of a conduction band of the third semiconductor layer.

a semiconductor apparatus includes: a first semiconductor layer of a first conductivity type; a second semiconductor layer of a second conductivity type; and a third semiconductor layer of the first conductivity type, wherein: the second semiconductor layer is formed between the first and third semiconductor layers, and the first and second semiconductor layers are in contact with each other; and energy $E_{C1}$ at a bottom edge of a conduction band of the first semiconductor layer is lower than energy $E_{V2}$ at a top edge of a valence band of the second semiconductor layer, and the energy $E_{V2}$ at the top edge of the valence band of the second semiconductor layer is substantially the same as energy $E_{C3}$ at a bottom edge of a conduction band of the third semiconductor layer.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

In order to obtain a signal source having a high frequency close to that of terahertz waveforms by using an Esaki diode or an RTD, a passive mixer may be used to upconvert the oscillation frequency. There are two types of passive mixers, i.e., a passive mixer 531 having a downconverting function and a passive mixer 532 having an upconverting function.

Figure 1A:
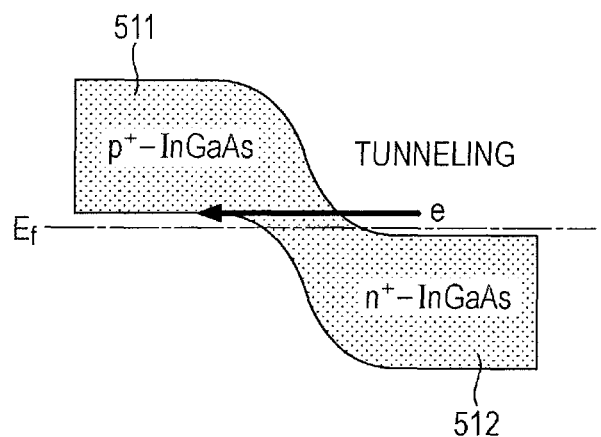
FIGS. 1A and 1B illustrate an Esaki diode.
Figure 1B:
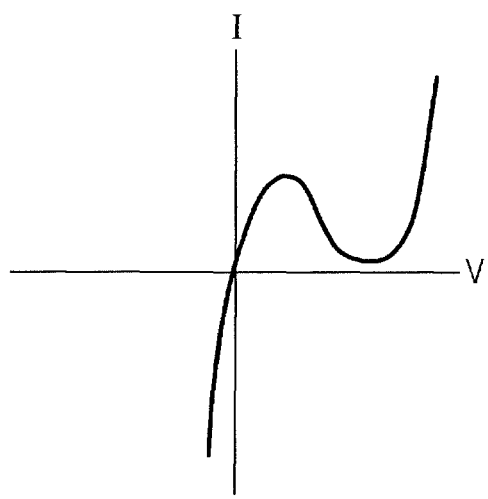
Figure 2A:
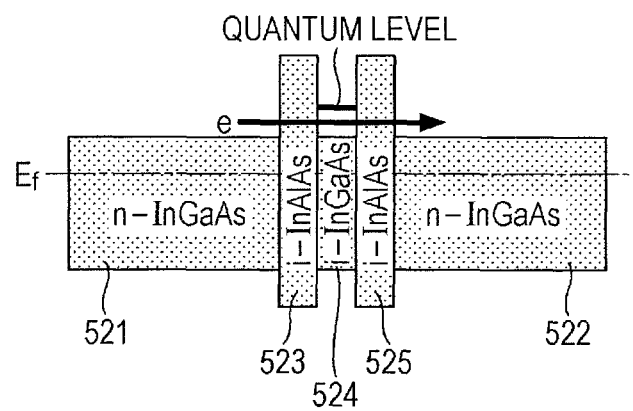
FIGS. 2A and 2B illustrate a resonant tunneling diode (RTD)
Figure 2B:
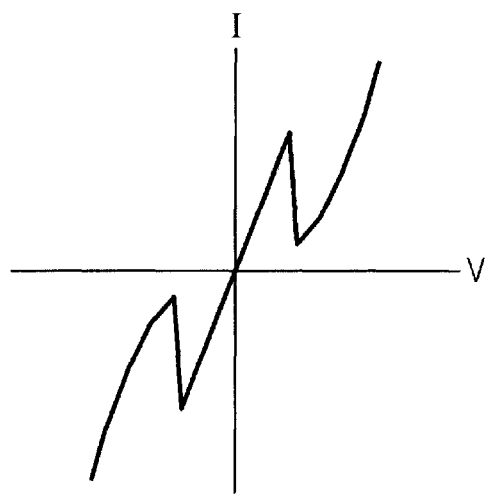
Figure 3A:
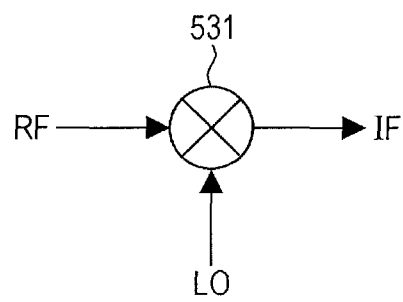
FIGS. 3A and 3B illustrate passive mixers.

More specifically, the passive mixer 531 having a downconverting function outputs, as illustrated in FIG. 3A, an intermediate frequency (IF) signal representing the difference between a local oscillator (LO) signal and an input radio frequency (RF) signal. The passive mixer 532 having an upconverting function outputs, as illustrated in FIG. 3B, an RF signal representing the sum of an LO signal and an IF signal.

Figure 3B:
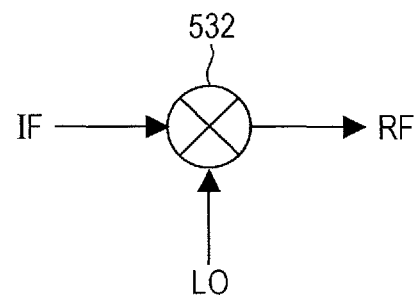
Figure 4A:
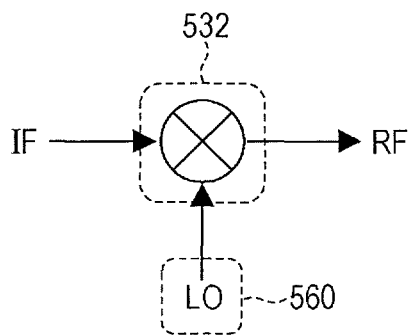
FIGS. 4A through 4D illustrate the structure of a passive mixer.
Figure 4B:
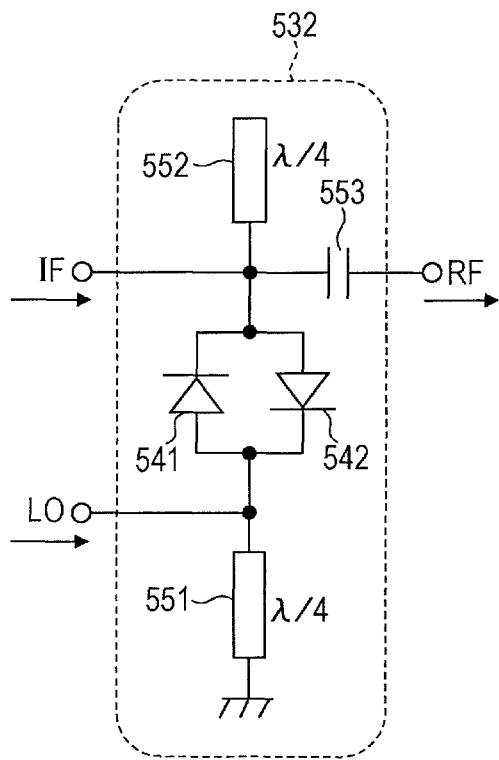
Figure 4C:
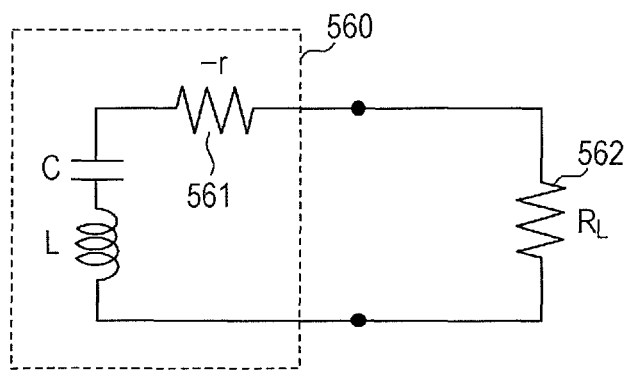
Figure 4D:
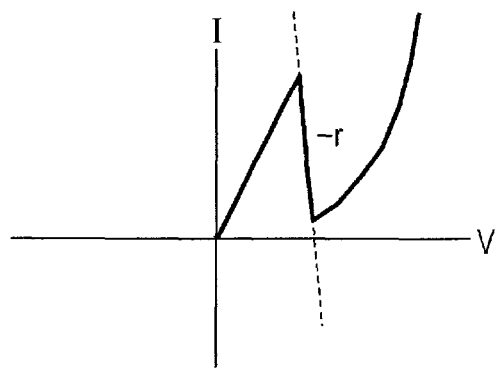

The passive mixer 532 having an upconverting function illustrated in FIGS. 3B and 4A includes, as illustrated in FIG. 4B, two diodes 541 and 542, transmission lines 551 and 552, and a capacitor 553. The diodes 541 and 542 are formed of nonlinear diodes, such as Schottky diodes. Additionally, in order to input an LO signal, an oscillator 560 including an RTD is connected to the passive mixer 532. FIG. 4C is an equivalent circuit diagram of the oscillator 560. The oscillator 560 illustrated in FIG. 4C includes an RTD exhibiting a property of having a negative resistance 561. The oscillator 560 oscillates when a condition that a negative resistance value (−r) of the negative resistance 561 of the RTD and an external resistance value ($R_L$) of an external resistance 562 become equal to each other is satisfied. Accordingly, in the case of the use of the passive mixer 532 having an upconverting function, two types of diodes, i.e., an RTD and Schottky diodes, are utilized. However, an RTD and a Schottky diode have to be manufactured separately since the manufacturing operations for these diodes are very different. This increases the cost when manufacturing a circuit including an RTD and a Schottky diode. This also applies to the use of the passive mixer 531 having a downconverting function. In the passive mixer 531, two types of diodes, i.e., Schottky diodes used in the passive mixer 531 and an RTD used in an oscillator, are utilized.

If there were a diode having both a property of having a negative resistance exhibited by an RTD and a property of having a rectifying function exhibited by a Schottky diode, such a diode would be to provide both functions. That is, a circuit including an oscillator and a passive mixer may be manufactured by using a single diode without having to separately form two types of diodes, i.e., an RTD and Schottky diodes. This makes it possible to omit a manufacturing operation of forming a circuit including an oscillator and a passive mixer, thereby decreasing the cost.

Additionally, if a single diode has a property of having an RTD including a negative resistance and a property of having a Schottky diode including a rectifying function, two diodes, i.e., an RTD and a Schottky diode, may be formed as one diode.

It is thus desirable to provide a semiconductor apparatus having a property of exhibiting a negative resistance and a property of having a rectifying function by using a single diode.

Embodiments will be described below. The same components and elements are designated by like reference numerals, and an explanation thereof will be given only once.

First Embodiment

Semiconductor Apparatus

Figure 5:
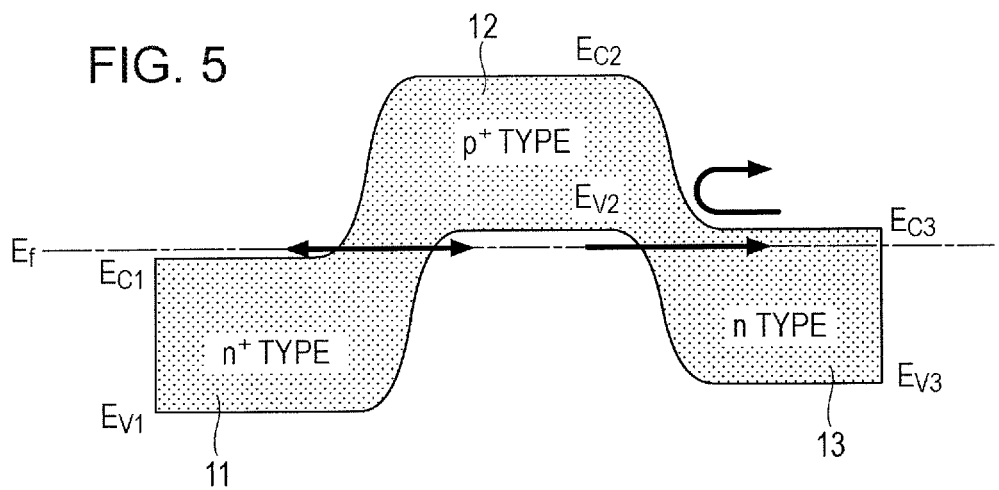
FIG. 5 illustrates a semiconductor apparatus of a first embodiment.

A first embodiment will be described below. A semiconductor diode, which serves as a semiconductor apparatus of the first embodiment, will be discussed below with reference to FIG. 5. The semiconductor apparatus of the first embodiment is formed such that an $n^+$-type first semiconductor layer 11, a $p^+$-type second semiconductor layer 12, and an n-type third semiconductor layer 13 are connected to one another. The $n^+$-type first semiconductor layer 11 is heavily doped with an impurity element to such a degree as to cause electron degeneracy. The $p^+$-type second semiconductor layer 12 is heavily doped with an impurity element to such a degree as to cause hole degeneracy.

In the semiconductor apparatus of the first embodiment, the energy $E_{C1}$ at the bottom edge of the conduction band of the first semiconductor layer 11 is lower than the energy $E_{V2}$ at the top edge of the valence band of the second semiconductor layer 12. That is, the semiconductor apparatus is formed such that $E_{C1} < E_{V2}$. More preferably, the energy $E_{C1}$ at the bottom edge of the conduction band of the first semiconductor layer 11 is lower than the Fermi level $E_f$, and the energy $E_{V2}$ at the top edge of the valence band of the second semiconductor layer 12 is higher than the Fermi level $E_f$. That is, the semiconductor apparatus is formed such that $E_{C1} < E_f < E_{V2}$. With this configuration, between the first and second semiconductor layers 11 and 12, a band structure in which electron tunneling is implemented is formed, and a negative resistance is exhibited in current-voltage (I-V) characteristics.

Additionally, the energy $E_{V2}$ at the top edge of the valence band of the second semiconductor layer 12 is substantially the same as the energy $E_{C3}$ at the bottom edge of the conduction band of the third semiconductor layer 13. That is, the semiconductor apparatus is formed such that $E_{V2} \approx E_{C3}$. With this configuration, between the second and third semiconductor layers 12 and 13, a band structure in which electron tunneling is implemented is formed, and the semiconductor apparatus exhibits a rectifying function.

Accordingly, in the semiconductor apparatus of the first embodiment, the first semiconductor layer 11 is more heavily doped with an impurity element than the third semiconductor layer 13.

Figure 6:
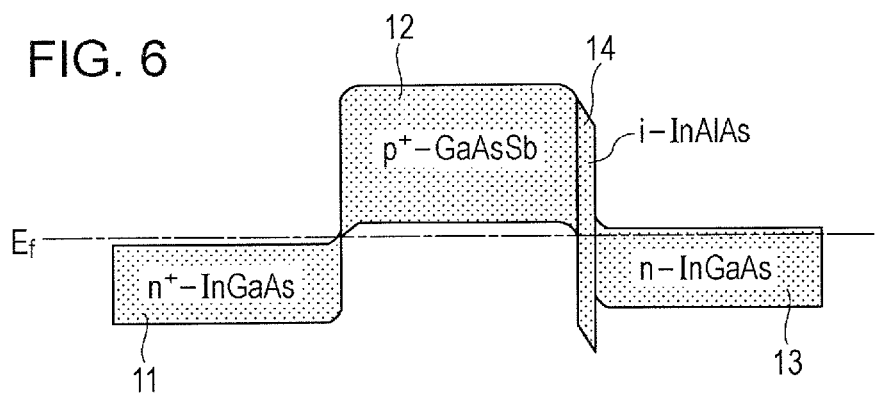
FIG. 6 illustrates a semiconductor apparatus including a barrier layer according to the first embodiment.

A semiconductor apparatus including a barrier layer of the first embodiment will now be described below with reference to FIG. 6. A diode, which is the semiconductor apparatus of the first embodiment, is formed such that an $n^+$-type first semiconductor layer 11, a $p^+$-type second semiconductor layer 12, a barrier layer 14, which is not doped with impurities, and an n-type third semiconductor layer 13, are stacked on top of one another.

The first semiconductor layer 11 is formed of $n^+$-InGaAs having a thickness of 50 nm and is doped with $1 \times 10^{19}$ cm$^{-3}$ of Si as an impurity element. The second semiconductor layer 12 is formed of $p^+$-GaAsSb having a thickness of 50 nm and is doped with $2 \times 10^{19}$ cm$^{-3}$ of Zn as an impurity element. The second semiconductor layer 12 may be formed of $p^+$-GaSb. The barrier layer 14, which is formed in order to stop impurities from diffusing to other regions, is formed of i-InAlAs having a thickness of 5 nm. The third semiconductor layer 13 is formed of n-InGaAs having a thickness of 50 nm and is doped with $1 \times 10^{18}$ cm$^{-3}$ of Si as an impurity element.

Figure 7:
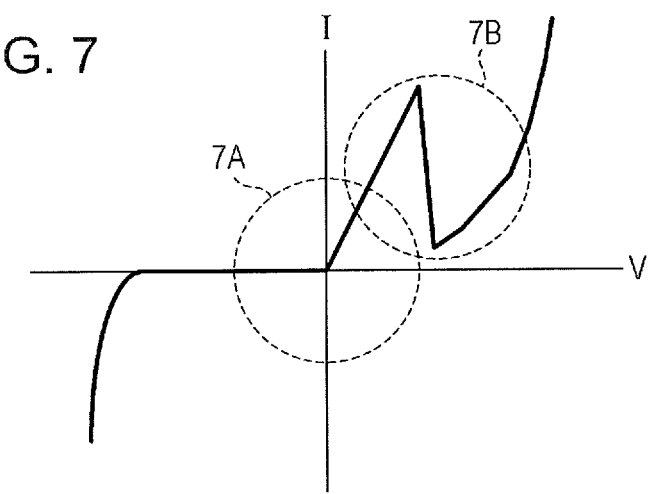
FIG. 7 illustrates current-voltage characteristics of the semiconductor apparatus illustrated in FIG. 6.

In the diode, which is the semiconductor apparatus of the first embodiment, a negative resistance is generated between the first and second semiconductor layers 11 and 12 due to interband quantum tunneling, and a rectifying action is produced between the second and third semiconductor layers 12 and 13 via the barrier layer 14. FIG. 7 illustrates current-voltage (I-V) characteristics of the diode of the first embodiment illustrated in FIG. 6. In the diode of the first embodiment, a rectifying action is produced in the vicinity of a zero bias region denoted by a broken circle 7A, and when a forward bias is applied to the third semiconductor layer 13, a negative resistance is generated, as indicated by a region denoted by a broken circle 7B. Accordingly, the diode of the first embodiment has both a property of having a rectifying function and a property of exhibiting a negative resistance. The rectifying function exhibited in the region denoted by the broken circle 7A may be used in a passive mixer, while the property of having a negative resistance exhibited in the region denoted by the broken circle 7B may be used in an oscillator. The characteristics of the diode of the first embodiment illustrated in FIG. 7 are characteristics exhibited when the first semiconductor layer 11 is grounded.

(Manufacturing Method for Semiconductor Apparatus)

A manufacturing method for a diode, which is the semiconductor apparatus of the first embodiment, will be described below with reference to FIGS. 8A through 9B.

Figure 8A:
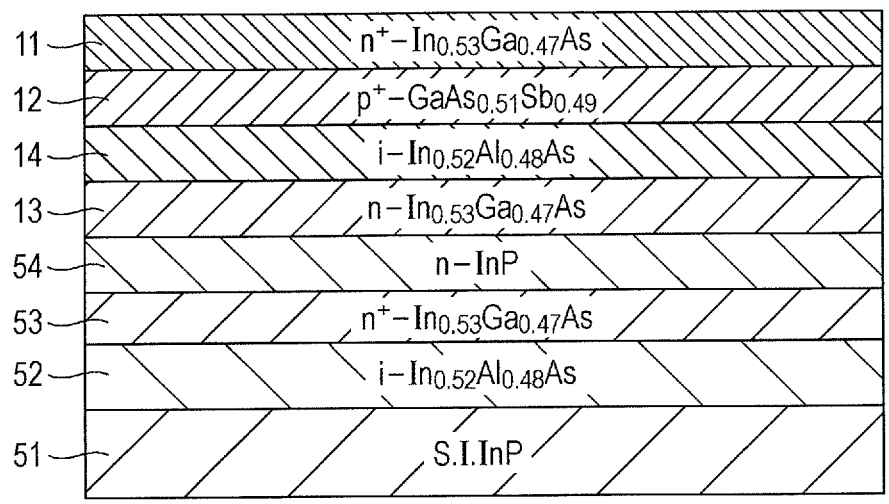
FIGS. 8A through 9B illustrate operations for a manufacturing method of the semiconductor apparatus according to the first embodiment.

First, as illustrated in FIG. 8A, semiconductor layers are stacked on top of one another on a semi-insulating InP substrate 51 by using an epitaxial growth technology using a metal organic chemical vapor deposition (MOCVD) process. More specifically, on the InP substrate 51, an i-InAlAs buffer layer 52, an n$^+$-InGaAs contact layer 53, and an n-InP layer 54 are sequentially formed on one another. On the n-InP layer 54, an n-InGaAs layer, which is to form the third semiconductor layer 13, an i-InAlAs layer, which is to form the barrier layer 14, a p$^+$-GaAsSb layer, which is to form the second semiconductor layer 12, and an n$^+$-InGaAs layer, which is to form the first semiconductor layer 11 are sequentially formed on one another.

The i-InAlAs buffer layer 52 is formed of i-$In_{0.52}Al_{0.48}As$ and has a thickness of about 300 nm.

The n$^+$-InGaAs contact layer 53 is formed of n$^+$-$In_{0.53}Ga_{0.47}As$ and has a thickness of about 200 nm. The n$^+$-InGaAs contact layer 53 is doped with $1\times10^{19}$ cm$^{-3}$ of Si as an impurity element.

The n-InP layer 54 is to form an etching stop layer and has a thickness of about 5 nm. The n-InP layer 54 is doped with $1\times10^{18}$ cm$^{-3}$ of Si as an impurity element.

The third semiconductor layer 13 is formed of n-$In_{0.53}Ga_{0.47}As$ and has a thickness of about 50 nm. The third semiconductor layer 13 is doped with $1\times10^{18}$ cm$^{-3}$ of Si as an impurity element.

The barrier layer 14 is formed of i-$In_{0.52}Al_{0.48}As$ and has a thickness of about 5 nm.

The second semiconductor layer 12 is formed of p$^+$-$GaAs_{0.51}Sb_{0.49}$ and has a thickness of about 50 nm. The second semiconductor layer 12 is doped with $2\times10^{19}$ cm$^{-3}$ of Zn as an impurity element.

The first semiconductor layer 11 is formed of n$^+$-$In_{0.53}Ga_{0.47}As$ and has a thickness of about 50 nm. The first semiconductor layer 11 is doped with $1\times10^{19}$ cm$^{-3}$ of Si as an impurity element.

Lattice matching is established between all of the above-described compounds $In_{0.52}Al_{0.48}As$, $In_{0.53}Ga_{0.47}As$, and $GaAs_{0.51}Sb_{0.49}$ and InP.

Figure 8B:
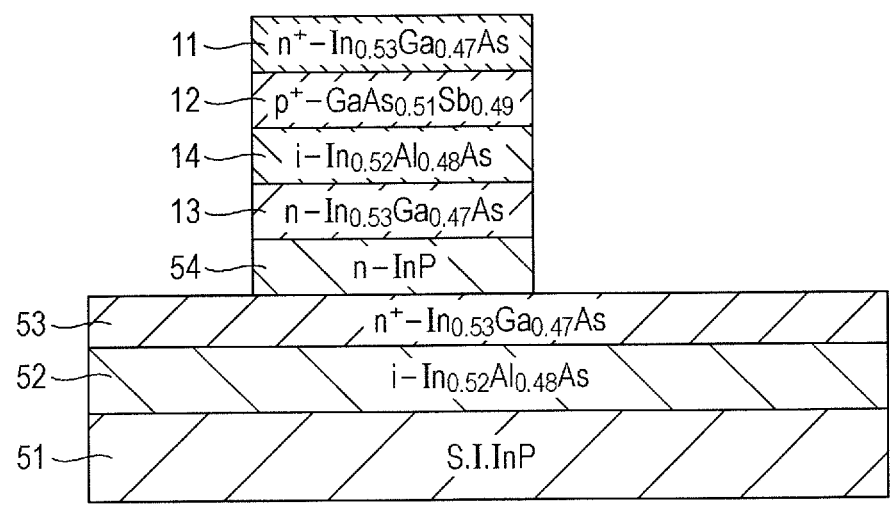

Then, as illustrated in FIG. 8B, the surface of the n$^+$-InGaAs contact layer 53 is partially exposed by performing wet-etching on the semiconductor layers. More specifically, a photoresist is applied to the surface of the n$^+$-InGaAs layer, which is to form the first semiconductor layer 11, and exposure by the use of an exposure device and development is performed, thereby forming a resist pattern. Then, wet-etching is performed, thereby removing semiconductor layers formed in the area on which the resist pattern is not formed. In wet-etching, the n$^+$-InGaAs layer, which is to form the first semiconductor layer 11, the p$^+$-GaAsSb layer, which is to form the second semiconductor layer 12, the i-InAlAs layer, which is to form the barrier layer 14, and the n-InGaAs layer, which is to form the third semiconductor layer 13, are removed by using a mixture of phosphoric acid and hydrogen peroxide solution. Then, the n-InP layer 54 is removed by using hydrochloric acid. With this process, the surface of the n$^+$-InGaAs contact layer 53 is partially exposed.

In this manner, the n$^+$-InGaAs layer, which is to form the first semiconductor layer 11, the p$^+$-GaAsSb layer, which is to form the second semiconductor layer 12, the i-InAlAs layer, which is to form the barrier layer 14, the n-InGaAs layer, which is to form the third semiconductor layer 13, and the n-InP layer 54 are formed in a mesa configuration. Thereafter, the resist pattern is removed by using, for example, an organic solvent.

Figure 9A:
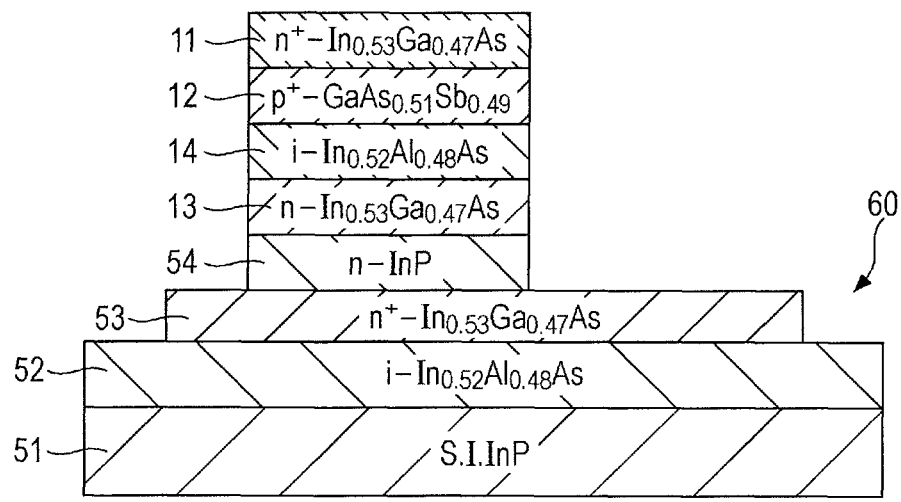

Subsequently, as illustrated in FIG. 9A, an element isolation region 60 is formed. More specifically, a photoresist is applied to the side on which the surface of the n$^+$-InGaAs contact layer 53 is exposed, and exposure by use of an exposure device and development is performed, thereby forming a resist pattern having an opening in the area in which the element isolation region 60 is to be formed. Then, the n$^+$-InGaAs contact layer 53 formed in the area on which the resist pattern is not formed is removed by performing wet-etching with a mixture of phosphoric acid and hydrogen peroxide solution, thereby forming the element isolation region 60. Thereafter, the resist pattern is removed by using, for example, an organic solvent.

Figure 9B:
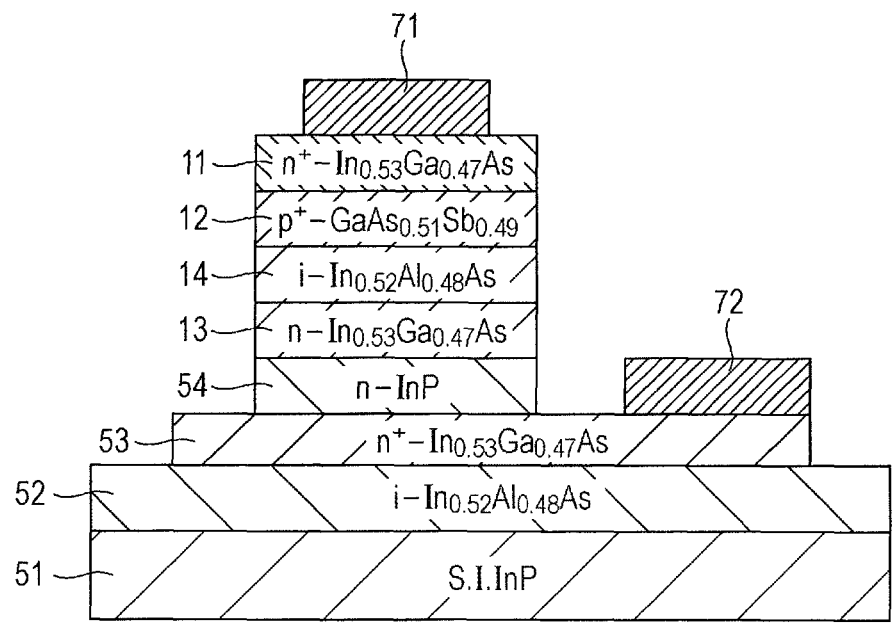

Then, as illustrated in FIG. 9B, a first electrode 71 and a second electrode 72 are formed. More specifically, a photoresist is applied to the side on which the surface of the n$^+$-InGaAs contact layer 53 is exposed, and exposure by use of an exposure device and development is performed, thereby forming a resist pattern having openings in the area in which the first and second electrodes 71 and 72 are to be formed. Thereafter, a metallic film on which 10-nm Ti, 30-nm Pt, 300-nm Au are stacked on top of one another is formed by vacuum deposition, and is immersed in an organic solvent, thereby removing the metallic film formed on the resist pattern by using a lift-off process. In this manner, the first electrode 71, which establishes ohmic contact with the n$^+$-InGaAs layer, which is to form the first semiconductor layer 11, is formed, and the second electrode 72, which establishes ohmic contact with the n$^+$-InGaAs contact layer 53, is formed. The first and second electrodes 71 and 72 serve as electrodes of the diode, which is the semiconductor apparatus of the first embodiment, and the first electrode 71 serves as one of the diode electrodes, while the second electrode 72 serves as the other diode electrode.

According to the above-described manufacturing method, a diode having both a property of exhibiting a negative resistance and a property of having a rectifying function, i.e., the semiconductor apparatus of the first embodiment, is manufactured.

The diode, which is the semiconductor apparatus of the first embodiment, has both a property of exhibiting a negative resistance and a property of having a rectifying function. Accordingly, the diode may replace a diode having a negative resistance and a diode having a rectifying function, such as a Schottky diode. This simplifies the manufacturing process, and a circuit including a diode having a negative resistance and a diode having a rectifying function, such as a Schottky diode, may be manufactured with reduced cost.

Second Embodiment

A second embodiment will be described below. A manufacturing method for a diode, which is a semiconductor apparatus, according to the second embodiment will be described below with reference to FIGS. 10A through 12. The manufacturing method of the second embodiment is a method for manufacturing the semiconductor apparatus of the first embodiment and is different from the manufacturing method of the first embodiment.

Figure 10A:
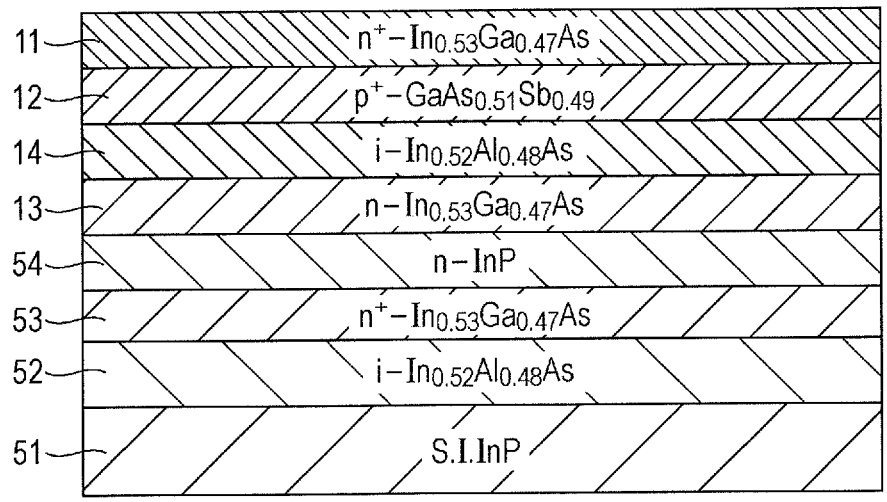
FIGS. 10A through 12 illustrate operations for a manufacturing method of a semiconductor apparatus according to a second embodiment.

First, as illustrated in FIG. 10A, semiconductor layers are stacked on top of one another on a semi-insulating InP substrate 51 by using an epitaxial growth technology using an MOCVD process. More specifically, on the InP substrate 51, an i-InAlAs buffer layer 52, an $n^+$-InGaAs contact layer 53, and an n-InP layer 54 are sequentially formed on one another. On the n-InP layer 54, an n-InGaAs layer, which is to form the third semiconductor layer 13, an i-InAlAs layer, which is to form the barrier layer 14, a $p^+$-GaAsSb layer, which is to form the second semiconductor layer 12, and an $n^+$-InGaAs layer, which is to form the first semiconductor layer 11 are sequentially formed on one another.

Figure 10B:
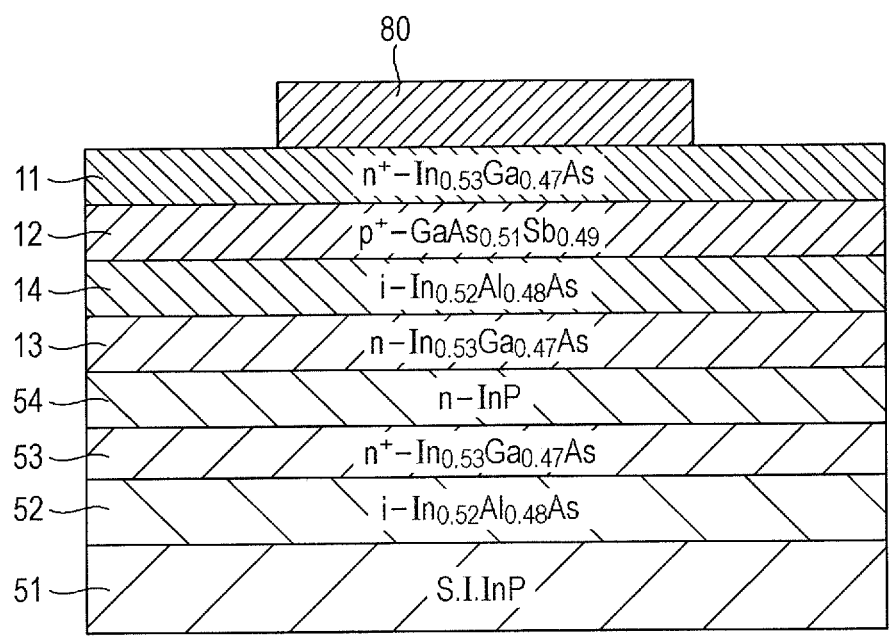

Then, as illustrated in FIG. 10B, a WSi layer 80 is formed. More specifically, a WSi film is formed on the $n^+$-InGaAs layer, which is to form the first semiconductor layer 11, by sputtering. A photoresist is then applied to the WSi film and exposure by the use of an exposure device and development is performed, thereby forming a resist pattern. Thereafter, the WSi film formed in the area on which the resist pattern is not formed is removed by performing dry-etching, such as reactive ion etching (RIE), by using a gas, such as $CF_4$ or $SF_6$, thereby forming the WSi layer 80. Then, the resist pattern is removed by using, for example, an organic solvent.

Figure 11A:
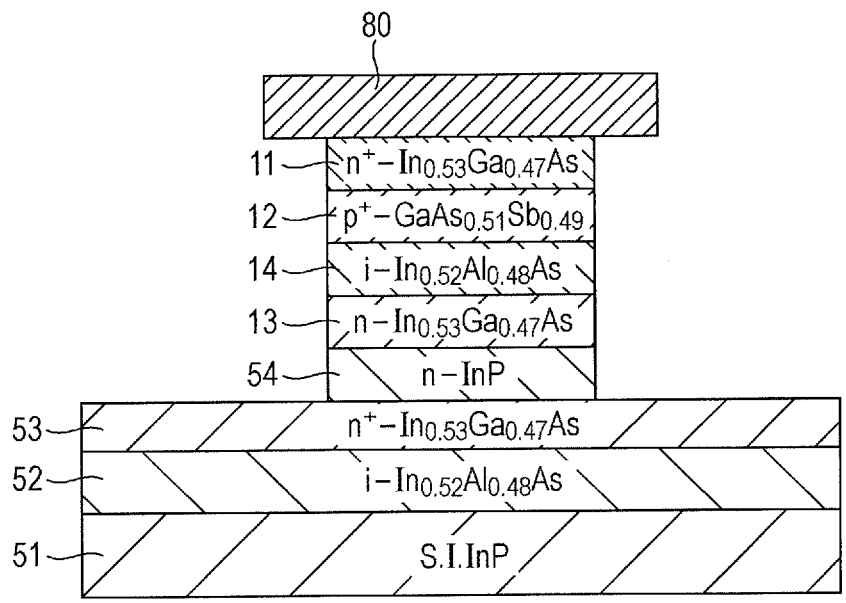

Then, as illustrated in FIG. 11A, the semiconductor layers formed in the area on which the WSi layer 80 is not formed is removed by performing wet-etching, thereby partially exposing the surface of the $n^+$-InGaAs contact layer 53. More specifically, wet-etching is performed by using the WSi layer 80 as a mask, thereby removing the semiconductor layers formed in the area on which the resist pattern is not formed. In wet-etching, the $n^+$-InGaAs layer, which is to form the first semiconductor layer 11, the $p^+$-GaAsSb layer, which is to form the second semiconductor layer 12, the i-InAlAs layer, which is to form the barrier layer 14, and the n-InGaAs layer, which is to form the third semiconductor layer 13, are removed by using a mixture of phosphoric acid and hydrogen peroxide solution. Then, the n-InP layer 54 is removed by using hydrochloric acid. With this process, the surface of the $n^+$-InGaAs contact layer 53 is partially exposed.

In this manner, the $n^+$-InGaAs layer, which is to form the first semiconductor layer 11, the $p^+$-GaAsSb layer, which is to form the second semiconductor layer 12, the i-InAlAs layer, which is to form the barrier layer 14, the n-InGaAs layer, which is to form the third semiconductor layer 13, and the n-InP layer 54 are formed in a mesa configuration. Since wet-etching is isotropic etching, the first semiconductor layer 11, the second semiconductor layer 12, the barrier layer 14, the third semiconductor layer 13, and the n-InP layer 54 are removed up to positions farther inward than the positions corresponding to the outer edges of the WSi layer 80.

Figure 11B:
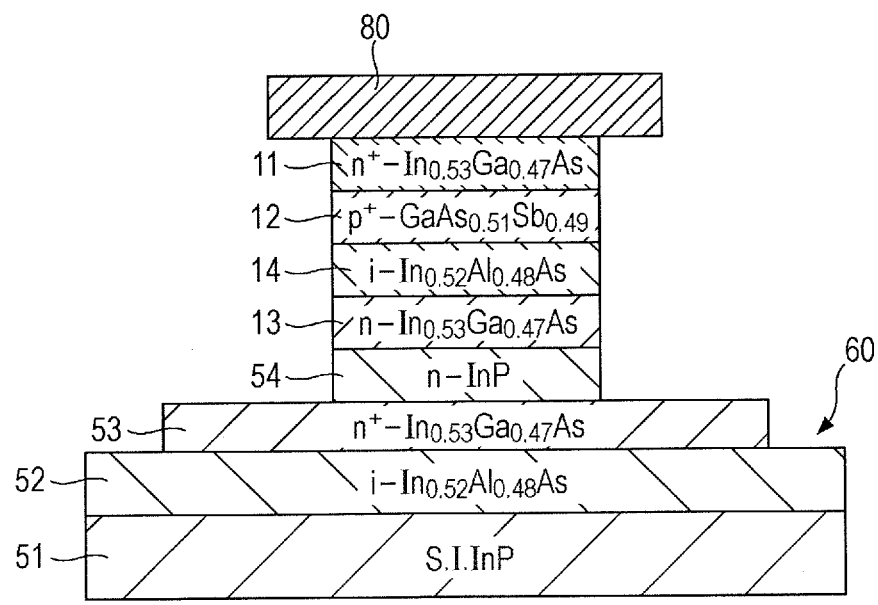

Subsequently, as illustrated in FIG. 11B, an element isolation region 60 is formed. More specifically, a photoresist is applied to the side on which the surface of the $n^+$-InGaAs contact layer 53 is exposed, and exposure by use of an exposure device and development is performed, thereby forming a resist pattern having an opening in an area in which the element isolation region 60 is to be formed. Then, the $n^+$-InGaAs contact layer 53 formed in the area on which the resist pattern is not formed is removed by performing wet-etching with a mixture of phosphoric acid and hydrogen peroxide solution, thereby forming the element isolation region 60. Thereafter, the resist pattern is removed by using, for example, an organic solvent.

Figure 12:
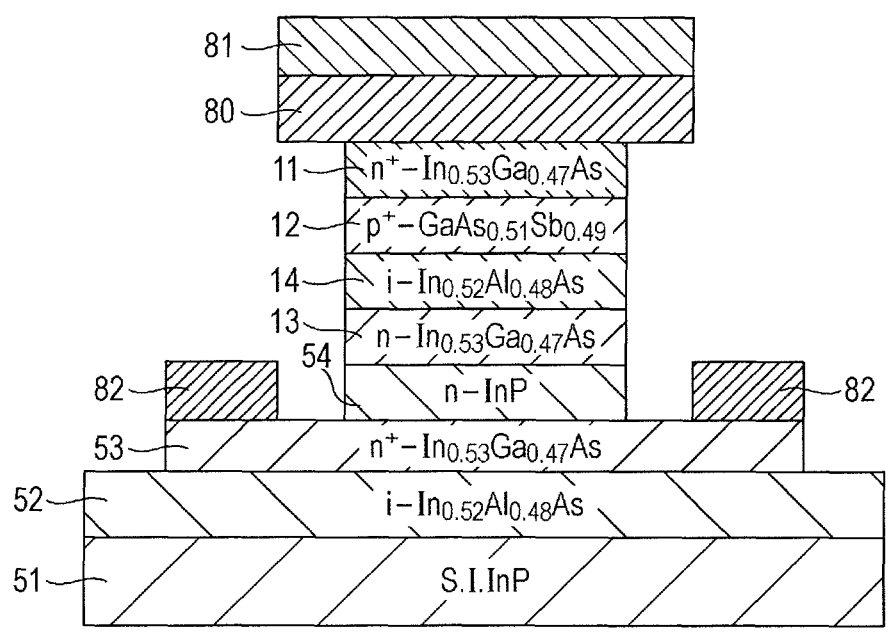

Then, as illustrated in FIG. 12, a first electrode 81 and a second electrode 82 are formed. More specifically, a photoresist is applied to the side on which the surface of the $n^+$-InGaAs contact layer 53 is exposed, and exposure by use of an exposure device and development is performed, thereby forming a resist pattern on the element isolation region 60. The resist pattern has openings in areas in which the first and second electrodes 81 and 82 are to be formed. The first and second electrodes 81 and 82 are formed by using a self-alignment technique, and thus, a resist pattern is not formed in the areas between the first and second electrodes 81 and 82.

Thereafter, a metallic film on which 10-nm Ti, 30-nm Pt, 70-nm Au are stacked on top of one another is formed by vacuum deposition, and is immersed in an organic solvent, thereby removing the metallic film formed on the resist pattern by using a lift-off process. In this case, the first and second electrodes 81 and 82 are formed by using a self-alignment technique with the WSi layer 80 therebetween, and thus, resistance components generated through the $n^+$-InGaAs contact layer 53 is reduced.

Generally, the first and second electrodes 81 and 82 are formed by using a lift-off process. In this case, however, it is very difficult to highly precisely perform positioning for areas in which the first and second electrodes 81 and 82 are to be formed. Accordingly, it is desirable to form the first and second electrodes 81 and 82 at positions separate from each other by a given distance with a certain allowance. In the second embodiment, however, the first and second electrodes 81 and 82 are formed by using a self-alignment technique with the WSi layer 80 therebetween, whereby the first and second electrodes 81 and 82 may be formed substantially precisely at positions separate from a certain distance from the n-InP layer 54. Thus, resistance components generated through the $n^+$-InGaAs contact layer 53 may be maintained at a certain value, and resistance components are easily suppressed without considering any allowance.

In this manner, the first electrode 81 is formed on the WSi layer 80, and the second electrode 82, which establishes ohmic contact with the $n^+$-InGaAs contact layer 53, is formed. The first and second electrodes 81 and 82 serve as electrodes of the diode, which is the semiconductor apparatus of the second embodiment, and the first electrode 81 serves as one of the diode electrodes, while the second electrode 82 serves as the other diode electrode.

According to the above-described manufacturing method, a diode, which is the semiconductor apparatus of the second embodiment, is manufactured.

The other configurations and features of the second embodiment are similar to those of the first embodiment.

Third Embodiment

Semiconductor Apparatus

A third embodiment will be described below. A semiconductor diode, which serves as a semiconductor apparatus of the third embodiment, will be discussed below with reference to FIG. 13. The semiconductor apparatus of the third embodiment is formed such that an n⁺-type first semiconductor layer 111, a fourth semiconductor layer 120, a p⁺-type second semiconductor layer 112, and an n-type third semiconductor layer 113 are connected to one another. The n⁺-type first semiconductor layer 111 is heavily doped with an impurity element to such a degree as to cause electron degeneracy. The p⁺-type second semiconductor layer 112 is heavily doped with an impurity element to such a degree as to cause hole degeneracy.

In the semiconductor apparatus of the third embodiment, the energy $E_{C1}$ at the bottom edge of the conduction band of the first semiconductor layer 111 is lower than the energy $E_{V2}$ at the top edge of the valence band of the second semiconductor layer 112. That is, the semiconductor apparatus is formed such that $E_{C1} < E_{V2}$. More preferably, the energy $E_{C1}$ at the bottom edge of the conduction band of the first semiconductor layer 111 is lower than the Fermi level $E_f$, and the energy $E_{V2}$ at the top edge of the valence band of the second semiconductor layer 112 is higher than the Fermi level $E_f$. That is, the semiconductor apparatus is formed such that $E_{C1} < E_f < E_{V2}$. With this configuration, between the first and second semiconductor layers 111 and 112, a band structure in which electron tunneling is implemented is formed, and a negative resistance is exhibited in current-voltage (I-V) characteristics.

Additionally, the energy $E_{V2}$ at the top edge of the valence band of the second semiconductor layer 112 is substantially the same as the energy $E_{C3}$ at the bottom edge of the conduction band of the third semiconductor layer 113. That is, the semiconductor apparatus is formed such that $E_{V2} \approx E_{C3}$. With this configuration, between the second and third semiconductor layers 112 and 113, a band structure in which electron tunneling is implemented is formed, and the semiconductor apparatus exhibits a rectifying function.

Accordingly, in the semiconductor apparatus of the third embodiment, the first semiconductor layer 111 is more heavily doped with an impurity element than the third semiconductor layer 113.

Figure 13:
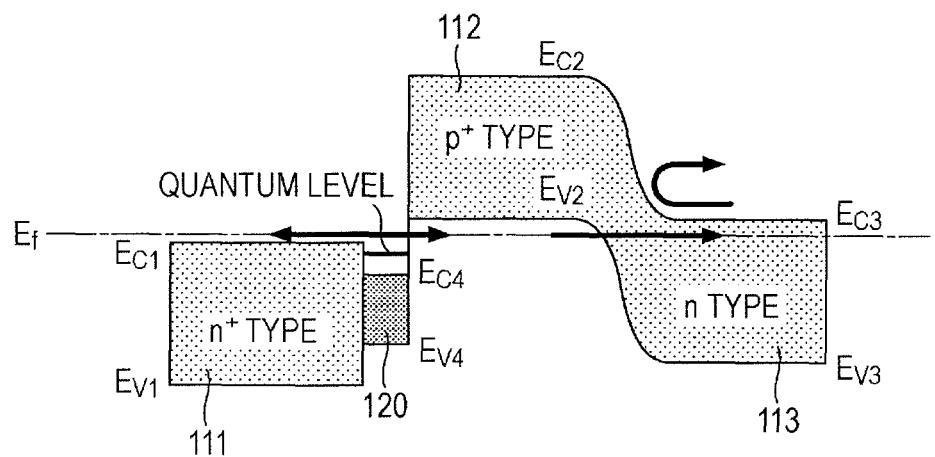
FIG. 13 illustrates a semiconductor apparatus of a third embodiment.

The fourth semiconductor layer 120 may be an n-type or p-type semiconductor layer, and in an example illustrated in FIG. 13, the fourth semiconductor layer 120 is of an n type. The fourth semiconductor layer 120 has a thickness of 10 nm or less so that a quantum level (discrete energy level) is formed. This forms resonant tunneling in the interband tunneling, thereby generating a negative resistance. The energy $E_{C4}$ at the bottom edge of the conduction band of the fourth semiconductor layer 120 is lower than the energy $E_{C1}$ at the bottom edge of the conduction band of the first semiconductor layer 111. That is, the semiconductor apparatus is formed such that $E_{C4} < E_{C1}$. Accordingly, generally, for the fourth semiconductor layer 120, a material having a narrower bandgap than a material for the first semiconductor layer 111 is used.

Figure 14:
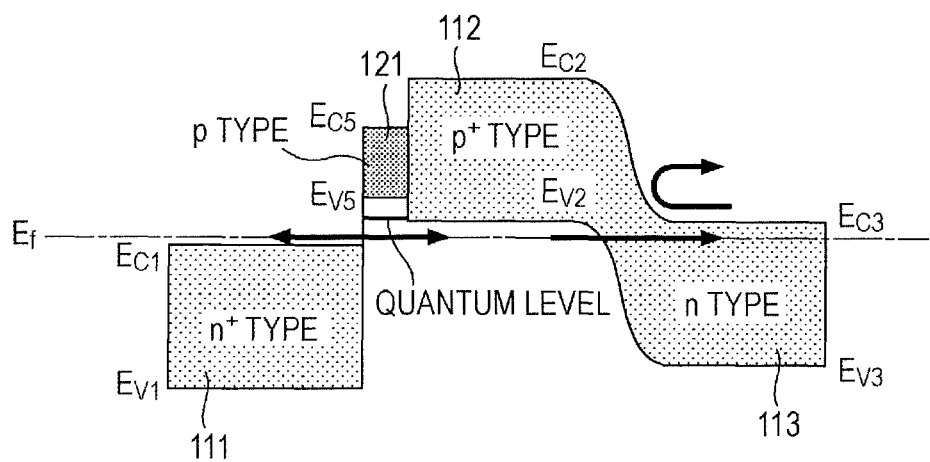
FIG. 14 illustrates another semiconductor apparatus of the third embodiment.

FIG. 13 illustrates that the n-type fourth semiconductor layer 120, however, a fourth semiconductor layer 121 may be of a p type, as illustrated in FIG. 14. In this case, the energy $E_{V5}$ at the top edge of the valence band of the fourth semiconductor layer 121 is higher than the energy $E_{V2}$ at the top edge of the valence band of the second semiconductor layer 112. That is, the semiconductor apparatus is formed such that $E_{V2} < E_{V5}$. Additionally, if the second semiconductor layer 112 is formed thin enough to form a quantum level in the second semiconductor layer 112, the formation of the fourth semiconductor layer 121 may be omitted, in which case, advantages similar to those of the above-described advantages may be obtained.

Figure 15:
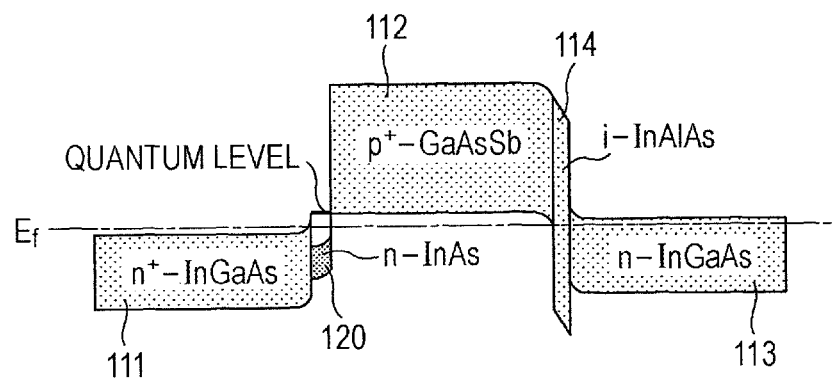
FIG. 15 illustrates a semiconductor apparatus including a barrier layer according to the third embodiment.

A semiconductor apparatus including a barrier layer according to the third embodiment will now be described below with reference to FIG. 15. A diode, which is the semiconductor apparatus of the third embodiment, is formed such that an n⁺-type first semiconductor layer 111, an n-type fourth semiconductor layer 120, a p⁺-type second semiconductor layer 112, a barrier layer 114, which is not doped with impurities, and an n-type third semiconductor layer 113, are stacked on top of one another.

The first semiconductor layer 111 is formed of n⁺-InGaAs having a thickness of 50 nm and is doped with $1\times10^{19}$ cm⁻³ of Si as an impurity element. The fourth semiconductor layer 120 is formed of n-InAs having a thickness of 5 nm and is doped with $5\times10^{18}$ cm⁻³ of Si as an impurity element. The second semiconductor layer 112 is formed of p⁺-GaAsSb having a thickness of 50 nm and is doped with $2\times10^{19}$ cm⁻³ of Zn as an impurity element. The second semiconductor layer 112 may be formed of p⁺-GaSb. The barrier layer 114, which is formed in order to stop impurities from diffusing to other regions, is formed of i-InAlAs having a thickness of 5 nm. The third semiconductor layer 113 is formed of n-InGaAs having a thickness of 50 nm and is doped with $1\times10^{18}$ cm⁻³ of Si as an impurity element.

Figure 16:
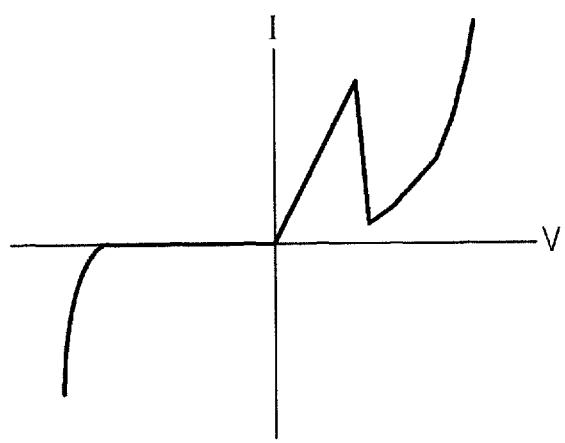
FIG. 16 illustrates current-voltage characteristics of the semiconductor apparatus illustrated in FIG. 15.

In the diode, which is the semiconductor apparatus of the third embodiment, a quantum level is formed in the fourth semiconductor layer 120 between the first and second semiconductor layers 111 and 112, thereby generating a negative resistance due to resonant tunneling. Additionally, a rectifying action is produced between the second and third semiconductor layers 112 and 113 via the barrier layer 14. FIG. 16 illustrates current-voltage (I-V) characteristics of the diode of the third embodiment illustrated in FIG. 15. In the diode of the third embodiment, a rectifying action is produced in the vicinity of a zero bias region, and when a forward bias is applied to the third semiconductor layer 113, a negative resistance is generated. Accordingly, the diode of the third embodiment has both a property of having a rectifying function and a property of exhibiting a negative resistance. The characteristics of the diode of the third embodiment illustrated in FIG. 16 are characteristics exhibited when the first semiconductor layer 111 is grounded.

(Manufacturing Method for Semiconductor Apparatus)

A manufacturing method for a diode, which is the semiconductor apparatus of the third embodiment, will be described below with reference to FIGS. 17A through 18B.

Figure 17A:
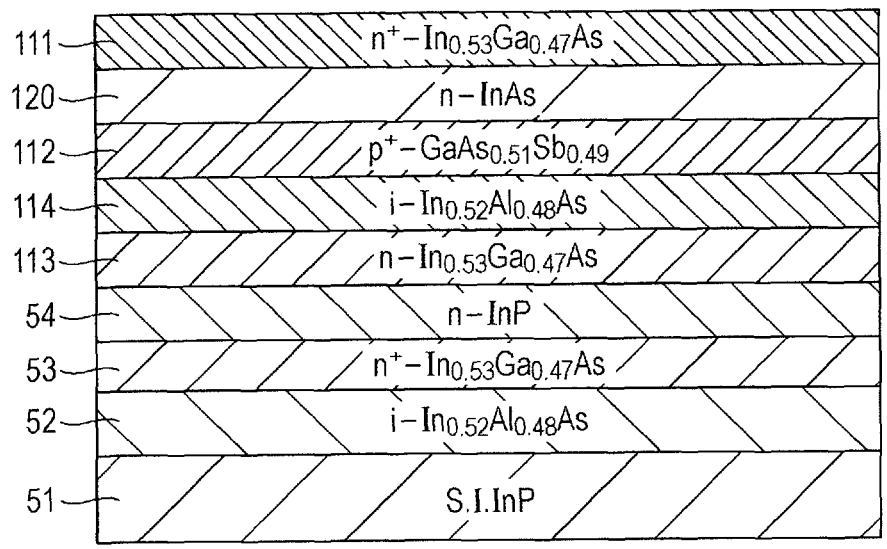
FIGS. 17A through 18B illustrate operations for a manufacturing method of a semiconductor apparatus according to the third embodiment.

First, as illustrated in FIG. 17A, semiconductor layers are stacked on top of one another on a semi-insulating InP substrate 51 by using an epitaxial growth technology using a MOCVD process. More specifically, on the InP substrate 51, an i-InAlAs buffer layer 52, an n⁺-InGaAs contact layer 53, and an n-InP layer 54 are sequentially formed on one another. On the n-InP layer 54, an n-InGaAs layer, which is to form the third semiconductor layer 113, an i-InAlAs layer, which is to form the barrier layer 114, a p⁺-GaAsSb layer, which is to form the second semiconductor layer 112, an n-InAs layer, which is to form the fourth semiconductor layer 120, and an n⁺-InGaAs layer, which is to form the first semiconductor layer 111 are sequentially formed on one another.

The third semiconductor layer 113 is formed of n-In$_{0.53}$Ga$_{0.47}$As and has a thickness of about 50 nm. The third semiconductor layer 113 is doped with $1\times10^{18}$ cm⁻³ of Si as an impurity element.

The barrier layer 114 is formed of i-In$_{0.52}$Al$_{0.48}$As and has a thickness of about 5 nm.

The second semiconductor layer 112 is formed of p$^+$-GaAs$_{0.51}$Sb$_{0.49}$ and has a thickness of about 50 nm. The second semiconductor layer 112 is doped with 2×10$^{19}$ cm$^{-3}$ of Zn as an impurity element.

The fourth semiconductor layer 120 is formed of n-InAs and has a thickness of about 5 nm. The fourth semiconductor layer 120 is doped with 1×10$^{18}$ cm$^{-3}$ of Si as an impurity element.

The first semiconductor layer 111 is formed of n$^+$-In$_{0.53}$Ga$_{0.47}$As and has a thickness of about 50 nm. The first semiconductor layer 111 is doped with 1×10$^{19}$ cm$^{-3}$ of Si as an impurity element.

Lattice matching is established between all of the above-described compounds In$_{0.52}$Al$_{0.48}$As, In$_{0.53}$Ga$_{0.47}$As, and GaAs$_{0.51}$Sb$_{0.49}$ and InP.

Figure 17B:
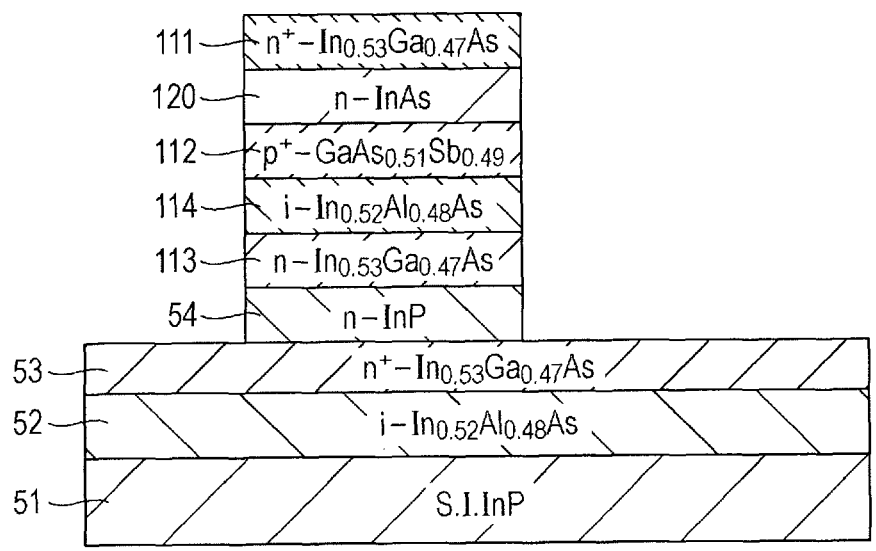

Then, as illustrated in FIG. 17B, the surface of the n$^+$-InGaAs contact layer 53 is partially exposed by performing wet-etching in the semiconductor layers. More specifically, a photoresist is applied to the surface of the n$^+$-InGaAs layer, which is to form the first semiconductor layer 111, and exposure by the use of an exposure device and development is performed, thereby forming a resist pattern. Then, wet-etching is performed, thereby removing semiconductor layers formed in the area on which the resist pattern is not formed. In wet-etching, the first semiconductor layer 111, the fourth semiconductor layer 120, the second semiconductor layer 112, the barrier layer 114, and the third semiconductor layer 113 are removed by using a mixture of phosphoric acid and hydrogen peroxide solution. Then, the n-InP layer 54 is removed by using hydrochloric acid. With this process, the surface of the n$^+$-InGaAs contact layer 53 is partially exposed.

In this manner, the first semiconductor layer 111, the fourth semiconductor layer 120, the second semiconductor layer 112, the barrier layer 114, the third semiconductor layer 113, and the n-InP layer 54 are formed in a mesa configuration. Thereafter, the resist pattern is removed by using, for example, an organic solvent.

Figure 18A:
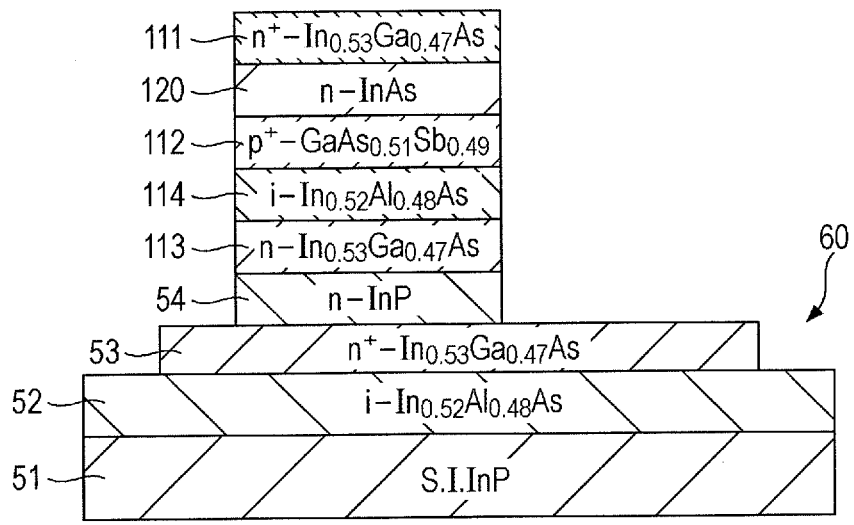

Subsequently, as illustrated in FIG. 18A, an element isolation region 60 is formed. More specifically, a photoresist is applied to the side on which the surface of the n$^+$-InGaAs contact layer 53 is exposed, and exposure by use of an exposure device and development is performed, thereby forming a resist pattern having an opening in an area in which the element isolation region 60 is to be formed. Then, the n$^+$-InGaAs contact layer 53 formed in the area on which the resist pattern is not formed is removed by performing wet-etching with a mixture of phosphoric acid and hydrogen peroxide solution, thereby forming the element isolation region 60. Thereafter, the resist pattern is removed by using, for example, an organic solvent.

Figure 18B:
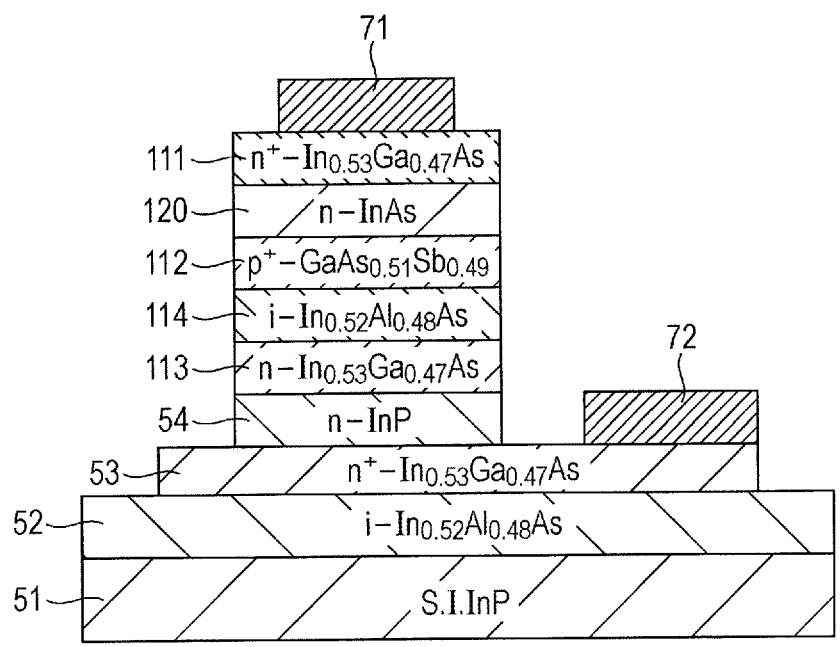

Then, as illustrated in FIG. 18B, a first electrode 71 and a second electrode 72 are formed. More specifically, a photoresist is applied to the side on which the surface of the n$^+$-InGaAs contact layer 53 is exposed, and exposure by use of an exposure device and development is performed, thereby forming a resist pattern having openings in areas in which the first and second electrodes 71 and 72 are to be formed. Thereafter, a metallic film on which 10-nm Ti, 30-nm Pt, 300-nm Au are stacked on top of one another is formed by vacuum deposition, and is immersed in an organic solvent, thereby removing the metallic film formed on the resist pattern by using a lift-off process. In this manner, the first electrode 71, which establishes ohmic contact with the n$^+$-InGaAs layer, which is to form the first semiconductor layer 111, is formed, and the second electrode 72, which establishes ohmic contact with the n$^+$-InGaAs contact layer 53, is formed. The first and second electrodes 71 and 72 serve as electrodes of the diode, which is the semiconductor apparatus of the third embodiment, and the first electrode 71 serves as one of the diode electrodes, while the second electrode 72 serves as the other diode electrode.

According to the above-described manufacturing method, a diode having both a property of exhibiting a negative resistance and a property of having a rectifying function, i.e., the semiconductor apparatus of the third embodiment, is manufactured.

The diode, which is the semiconductor apparatus of the third embodiment, has both a property of exhibiting a negative resistance and a property of having a rectifying function. Accordingly, the diode may be substituted for a diode having a negative resistance and a diode having a rectifying function, such as a Schottky diode. This simplifies the manufacturing process, and a circuit including a diode having a negative resistance and a diode having a rectifying function, such as a Schottky diode, may be manufactured with reduced cost. The other configurations and features of the third embodiment are similar to those of the first embodiment.

Fourth Embodiment

A fourth embodiment will be described below. A manufacturing method for a diode, which is a semiconductor apparatus, according to the fourth embodiment will be described below with reference to FIGS. 19A through 21. The manufacturing method of the fourth embodiment is a method for manufacturing the semiconductor apparatus of the third embodiment and is different from the manufacturing method of the third embodiment.

Figure 19A:
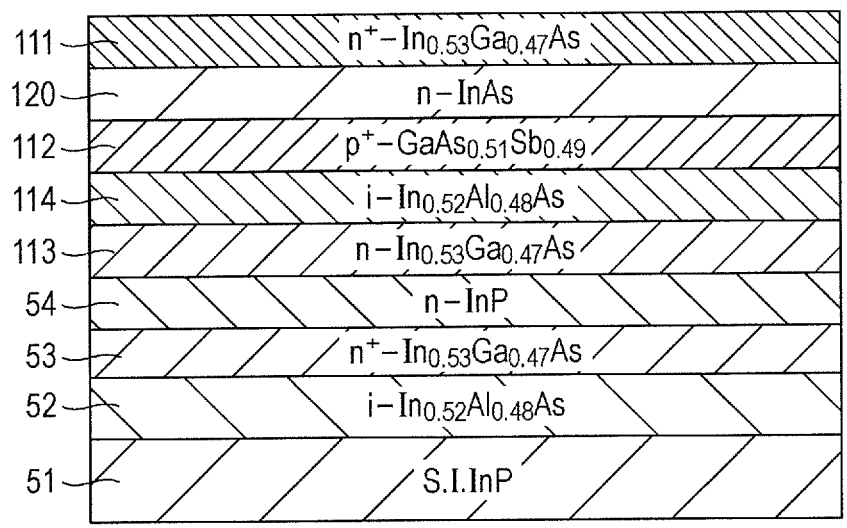
FIGS. 19A through 21 illustrate operations for a manufacturing method of a semiconductor apparatus according to a fourth embodiment.

First, as illustrated in FIG. 19A, semiconductor layers are stacked on top of one another on a semi-insulating InP substrate 51 by using an epitaxial growth technology using an MOCVD process. More specifically, on the InP substrate 51, an i-InAlAs buffer layer 52, an n$^+$-InGaAs contact layer 53, and an n-InP layer 54 are sequentially formed on one another. On the n-InP layer 54, an n-InGaAs layer, which is to form the third semiconductor layer 113, an i-InAlAs layer, which is to form the barrier layer 114, a p$^+$-GaAsSb layer, which is to form the second semiconductor layer 112, an n-InAs layer, which is to form the fourth semiconductor layer 120, and an n$^+$-InGaAs layer, which is to form the first semiconductor layer 111 are sequentially formed on one another.

Figure 19B:
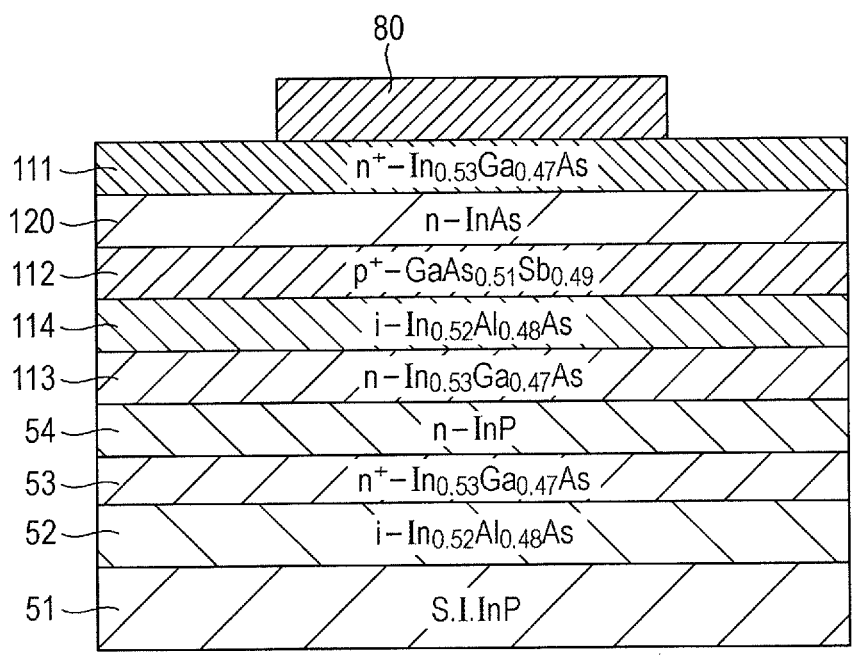

Then, as illustrated in FIG. 19B, a WSi layer 80 is formed. More specifically, a WSi film is formed on the n$^+$-InGaAs layer, which is to form the first semiconductor layer 111, by sputtering. A photoresist is then applied to the WSi film and exposure by the use of an exposure device and development is performed, thereby forming a resist pattern. Thereafter, the WSi film formed in the area on which the resist pattern is not formed is removed by performing dry-etching, such as RIE, by using a gas, such as CF$_4$ or SF$_6$, thereby forming the WSi layer 60. Then, the resist pattern is removed by using, for example, an organic solvent.

Figure 20A:
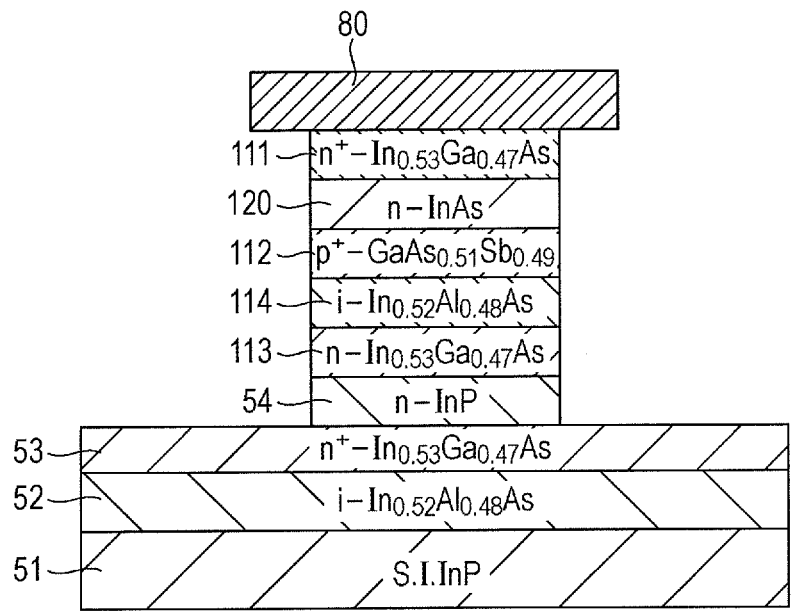

Then, as illustrated in FIG. 20A, the semiconductor layers formed in the area on which the WSi layer 80 is not formed is removed by performing wet-etching, thereby partially exposing the surface of the n$^+$-InGaAs contact layer 53. More specifically, wet-etching is performed by using the WSi layer 80 as a mask, thereby removing the semiconductor layers formed in the area on which the resist pattern is not formed. In wet-etching, the first semiconductor layer 111, the fourth semiconductor layer 120, the second semiconductor layer 112, the barrier layer 114, and the third semiconductor layer 113 are removed by using a mixture of phosphoric acid and hydrogen peroxide solution. Then, the n-InP layer 54 is removed by using hydrochloric acid. With this process, the surface of the n+-InGaAs contact layer 53 is partially exposed.

In this manner, the first semiconductor layer 111, the fourth semiconductor layer 120, the second semiconductor layer 112, the barrier layer 114, the third semiconductor layer 113, and the n-InP layer 54 are formed in a mesa configuration. Since wet-etching is isotropic etching, the first semiconductor layer 111, the fourth semiconductor layer 120, the second semiconductor layer 112, the barrier layer 114, the third semiconductor layer 113, and the n-InP layer 54 are removed up to positions farther inward than positions corresponding to the outer edges of the WSi layer 80.

Figure 20B:
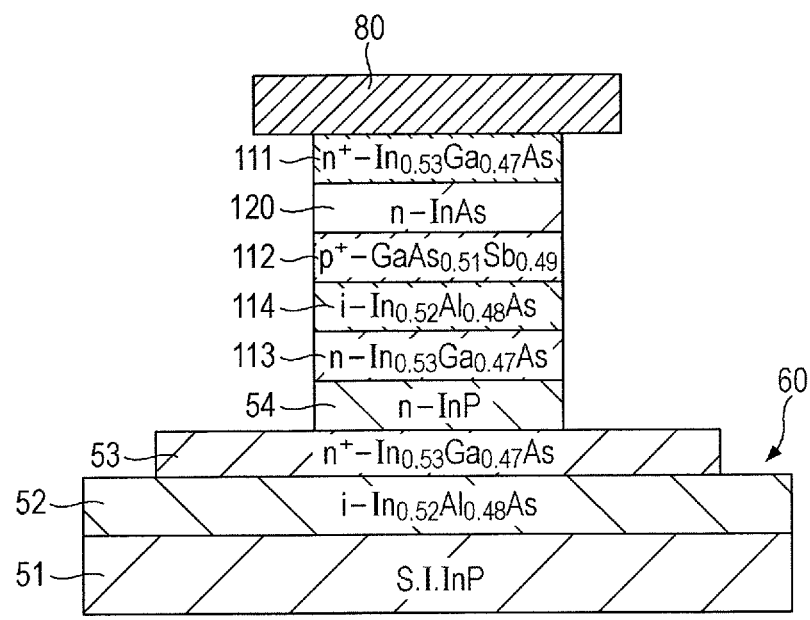

Subsequently, as illustrated in FIG. 20B, an element isolation region 60 is formed. More specifically, a photoresist is applied to the side on which the surface of the n+-InGaAs contact layer 53 is exposed, and exposure by use of an exposure device and development is performed, thereby forming a resist pattern having an opening in an area in which the element isolation region 60 is to be formed. Then, the n+-InGaAs contact layer 53 formed in the area on which the resist pattern is not formed is removed by performing wet-etching with a mixture of phosphoric acid and hydrogen peroxide solution, thereby forming the element isolation region 60. Thereafter, the resist pattern is removed by using, for example, an organic solvent.

Figure 21:
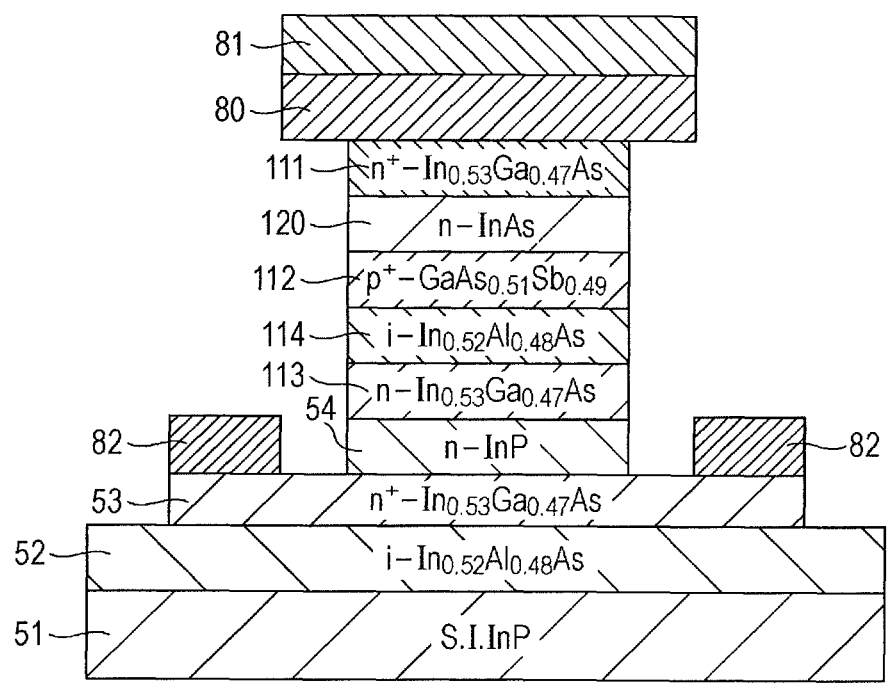

Then, as illustrated in FIG. 21, a first electrode 81 and a second electrode 82 are formed. More specifically, a photoresist is applied to the side on which the surface of the n+-InGaAs contact layer 53 is exposed, and exposure by use of an exposure device and development is performed, thereby forming a resist pattern on the element isolation region 60. This resist pattern has openings in areas in which the first and second electrodes 81 and 82 are to be formed.

Thereafter, a metallic film on which 10-nm Ti, 30-nm Pt, 70-nm Au are stacked on top of one another is formed by vacuum deposition, and is immersed in an organic solvent, thereby removing the metallic film formed on the resist pattern by using a lift-off process. In this case, the first and second electrodes 81 and 82 are formed by using a self-alignment technique with the WSi layer 80 therebetween, and thus, resistance components generated through the n+-InGaAs contact layer 53 are reduced.

In this manner, the first electrode 81 is formed on the WSi layer 80, and the second electrode 82, which establishes ohmic contact with the n+-InGaAs contact layer 53, is formed. The first and second electrodes 81 and 82 serve as electrodes of the diode, which is the semiconductor apparatus of the fourth embodiment, and the first electrode 81 serves as one of the diode electrodes, while the second electrode 82 serves as the other diode electrode.

According to the above-described manufacturing method, a diode, which is the semiconductor apparatus of the fourth embodiment, is manufactured.

Figure 22:
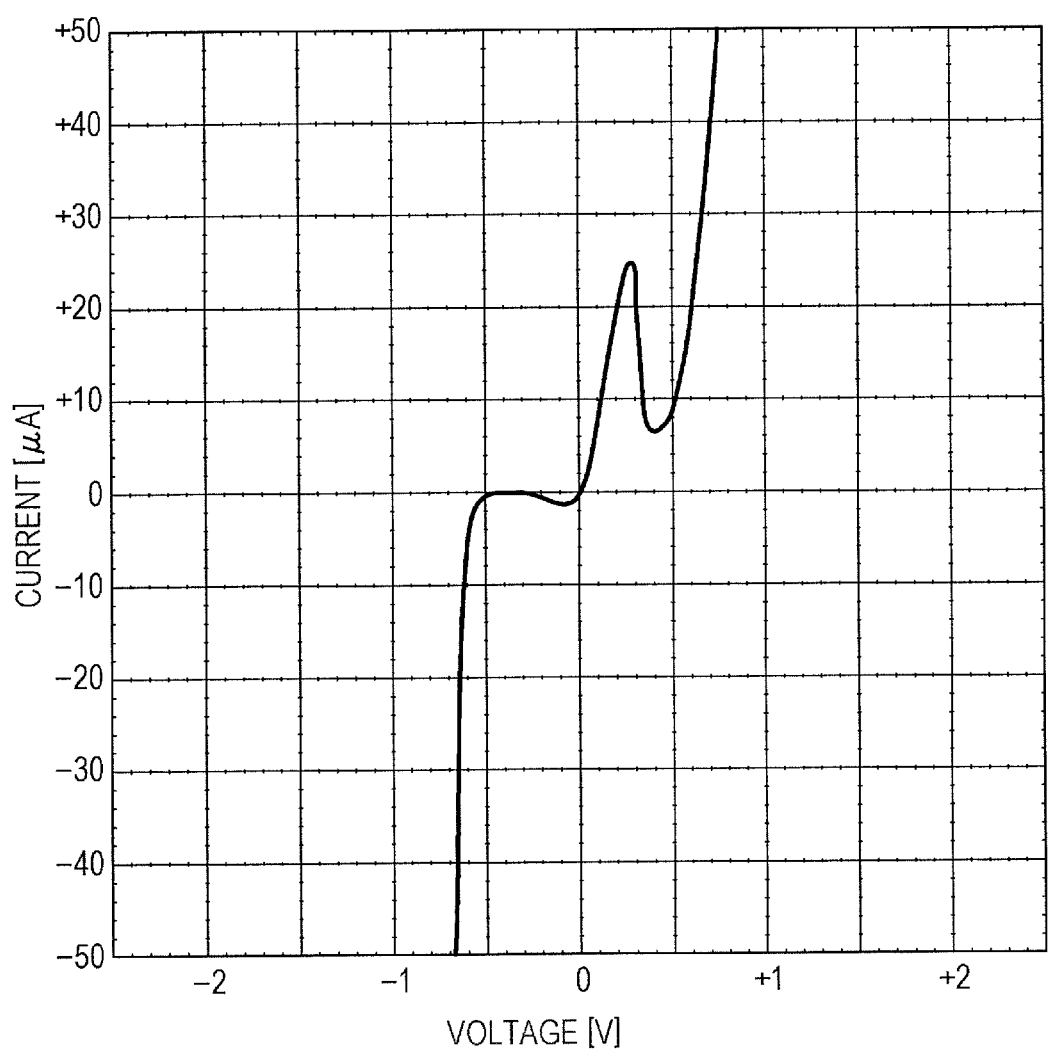
FIG. 22 illustrates current-voltage characteristics of the semiconductor apparatus manufactured in the fourth embodiment.

FIG. 22 illustrates I-V characteristics of the diode, which is the semiconductor apparatus manufactured by the manufacturing method of the fourth embodiment. The diode manufactured by the manufacturing method of the fourth embodiment exhibits a rectifying function having nonlinear characteristics in the vicinity of a zero bias region, and exhibits a negative resistance in which a current becomes maximum when the voltage is about +0.3 V and a current becomes minimum when the voltage is about +0.5 V. That is, the diode manufactured by the manufacturing method of the fourth embodiment has both a property of exhibiting a negative resistance and a property of having a rectifying function.

The other configurations and features of the fourth embodiment are similar to those of the first and third embodiments.

Fifth Embodiment

A fifth embodiment will be described below. A diode, which serves as a semiconductor apparatus of a fifth embodiment, will be discussed below with reference to FIG. 23. The diode, which is the semiconductor apparatus of the fifth embodiment, is formed such that an n+-type first semiconductor layer 111, an n-type fourth semiconductor layer 120, a p+-type second semiconductor layer 112, a barrier layer 114, an n-type fifth semiconductor layer 221, and an n-type third semiconductor layer 113 are stacked on top of one another.

The first semiconductor layer 111 is formed of n+-InGaAs having a thickness of 50 nm and is doped with $1 \times 10^{19}$ cm$^{-3}$ of Si as an impurity element. The fourth semiconductor layer 120 is formed of n-InAs having a thickness of 5 nm and is doped with $5 \times 10^{18}$ cm$^{-3}$ of Si as an impurity element. The second semiconductor layer 112 is formed of p+-GaAsSb having a thickness of 50 nm and is doped with $2 \times 10^{19}$ cm$^{-3}$ of Zn as an impurity element. The barrier layer 114 is formed of i-InAlAs having a thickness of 5 nm. The fifth semiconductor layer 221 is formed of n-InGaAs (In$_{0.8}$Ga$_{0.2}$As) having a thickness of 5 nm and is doped with $5 \times 10^{18}$ cm$^{-3}$ of Si as an impurity element. The third semiconductor layer 113 is formed of n-InGaAs having a thickness of 50 nm and is doped with $1 \times 10^{18}$ cm$^{-3}$ of Si as an impurity element.

Figure 24:
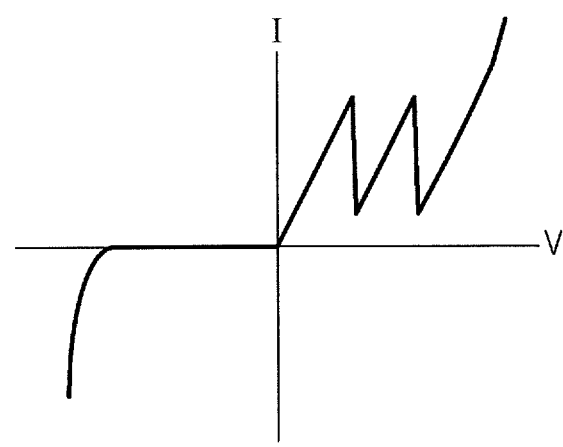
FIG. 24 illustrates current-voltage characteristics of the semiconductor apparatus illustrated in FIG. 23.

In the diode, which is the semiconductor apparatus of the fifth embodiment, a quantum level is formed in the fourth semiconductor layer 120 between the first and second semiconductor layers 111 and 112, thereby generating a negative resistance due to resonant tunneling. A quantum level is also formed in the fifth semiconductor layer 221 between the barrier layer 114 and the third semiconductor layer 113, thereby generating a negative resistance due to resonant tunneling. Accordingly, the diode exhibits a negative resistance twice, as illustrated in FIG. 24. Additionally, a rectifying action is produced between the second and third semiconductor layers 112 and 113 via the barrier layer 114, whereby a rectifying function is exhibited in the vicinity of a zero bias region. Accordingly, the diode of the fifth embodiment has a rectifying function and exhibits a negative resistance twice. I-V characteristics of the diode of the fifth embodiment illustrated in FIG. 24 are characteristics exhibited when the first semiconductor layer 111 is grounded.

Figure 23:
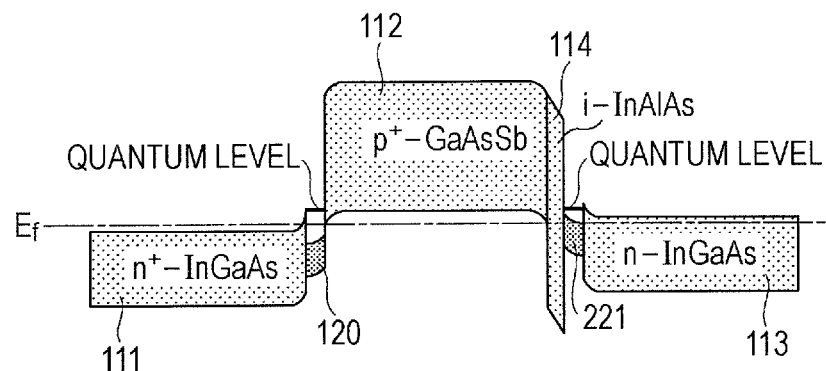
FIG. 23 illustrates a semiconductor apparatus of a fifth embodiment.
Figure 25:
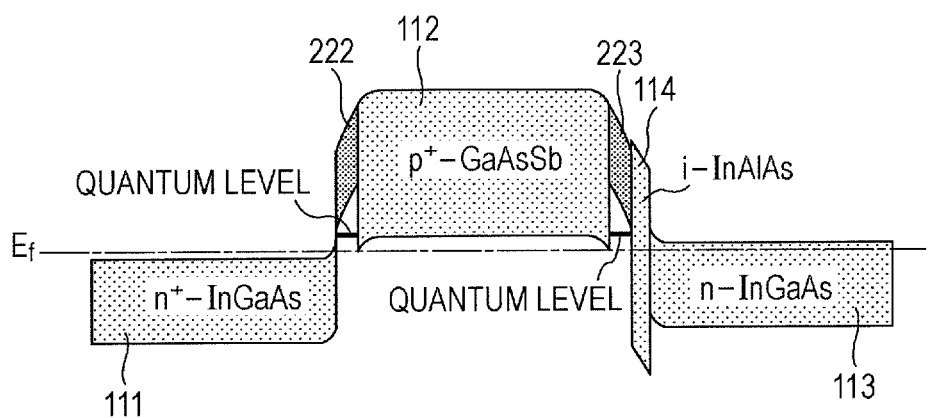
FIGS. 25 through 28 illustrate other semiconductor apparatuses of the fifth embodiment.
Figure 26:
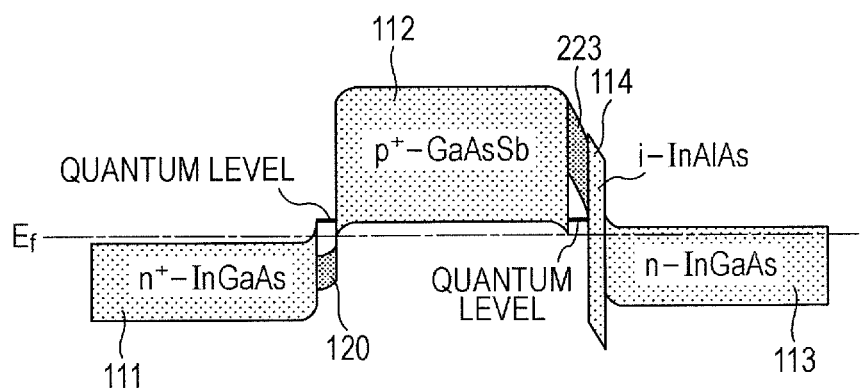
Figure 27:
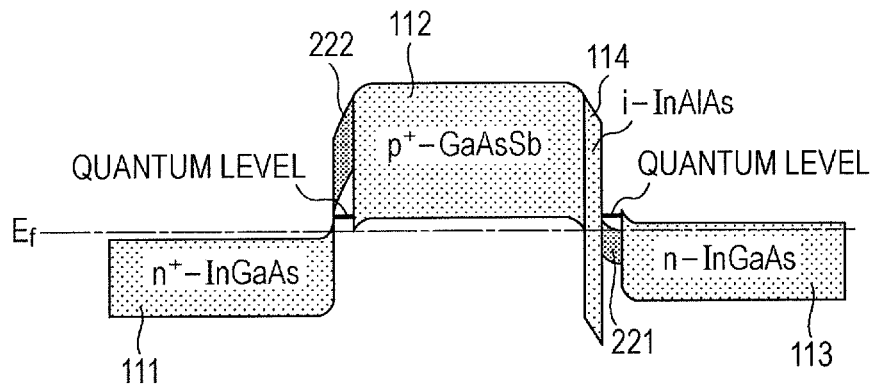

FIG. 23 illustrates a diode having a structure in which n-type semiconductors are used for both the fourth and fifth semiconductor layers 120 and 221. However, a diode having a structure in which p-type semiconductors are used for fourth and fifth semiconductor layers 222 and 223, as illustrated in FIG. 25, may be used. Alternatively, a diode having a structure in which an n-type semiconductor is used for the fourth semiconductor layer 120 and a p-type semiconductor is used for the fifth semiconductor layer 223, as illustrated in FIG. 26, may be used, and conversely, a diode having a structure in which a p-type semiconductor is used for the fourth semiconductor layer 222 and an n-type semiconductor is used for the fifth semiconductor layer 221, as illustrated in FIG. 27, may be used. In the diodes having the above-described structures, I-V characteristics similar to those illustrated in FIG. 24 may be obtained.

FIG. 25 illustrates a diode having a structure in which the p-type fourth semiconductor layer 222, which forms a quantum level, is provided between the first and second semiconductor layers 111 and 112, and the p-type fifth semiconductor layer 223, which forms a quantum level, is provided between the second semiconductor layer 112 and the barrier layer 114.

FIG. 26 illustrates a diode having a structure in which the n-type fourth semiconductor layer 120, which forms a quantum level, is provided between the first and second semiconductor layers 111 and 112, and the p-type fifth semiconductor layer 223, which forms a quantum level, is provided between the second semiconductor layer 112 and the barrier layer 114.

FIG. 27 illustrates a diode having a structure in which the p-type fourth semiconductor layer 222, which forms a quantum level, is provided between the first and second semiconductor layers 111 and 112, and the n-type fifth semiconductor layer 221, which forms a quantum level, is provided between the barrier layer 114 and the third semiconductor layer 113.

Figure 28:
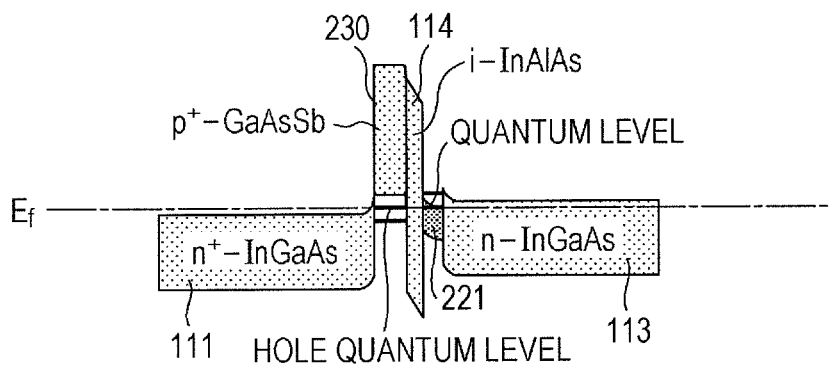
Figure 29:
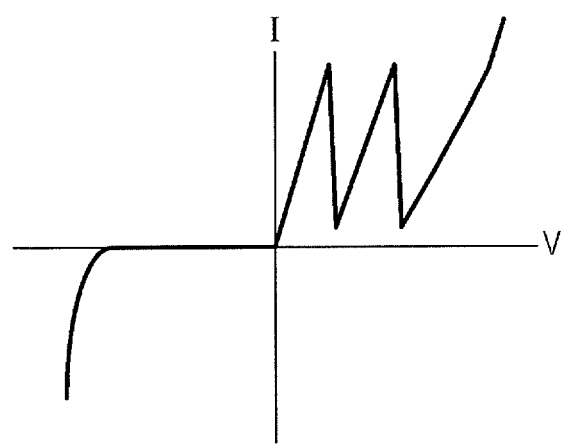
FIG. 29 illustrates current-voltage characteristics of the semiconductor apparatus illustrated in FIG. 28.

Alternatively, as illustrated in FIG. 28, the second semiconductor layer may be formed thin enough to have a thickness of about 10 nm, thereby forming a hole quantum level. More specifically, $p^+$-GaAsSb having a thickness of about 10 nm is used for forming a second semiconductor layer 230, and the n-type fifth semiconductor layer 221, which forms a quantum level, is formed between the barrier layer 114 and the third semiconductor layer 113. In the diode having this structure, a quantum level is formed in the second semiconductor layer 230, and a quantum level is also formed in the fifth semiconductor layer 221. Accordingly, it is possible to manufacture a diode in which a negative resistance is generated twice, as illustrated in FIG. 29, without forming a fourth semiconductor layer between the first and second semiconductor layers 111 and 230.

The other configurations and features of the fifth embodiment are similar to those of the third embodiment.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor apparatus comprising:
a first semiconductor layer of a first conductivity type;
a second semiconductor layer of a second conductivity type; and
a third semiconductor layer of the first conductivity type, wherein:
the second semiconductor layer is formed between the first and third semiconductor layers, and the first and second semiconductor layers are in contact with each other;
a first energy level at a bottom edge of a conduction band of the first semiconductor layer is lower than a second energy level at a top edge of a valence band of the second semiconductor layer;
the second energy level is higher than a Fermi level in the second semiconductor layer;
a third energy level at a bottom edge of a conduction band of the third semiconductor layer is higher than the Fermi level;
the first semiconductor layer is formed of $n^+$-$In_{0.53}Ga_{0.47}As$; and
the second semiconductor layer is formed of $p^+$-$GaAs_{0.51}Sb_{0.49}$.

2. The semiconductor apparatus according to claim 1, wherein a discrete energy level is formed in the second semiconductor layer.

3. The semiconductor apparatus according to claim 1, further comprising: a barrier layer formed of a semiconductor which is not doped with impurity elements and formed between the second and third semiconductor layers.

4. The semiconductor apparatus according to claim 3, wherein the barrier layer is formed of InAlAs.

5. The semiconductor apparatus according to claim 1, wherein, if a Fermi level is denoted by Er, a condition that the first energy level <Er<the second energy level is satisfied.

6. The semiconductor apparatus according to claim 1, wherein the first semiconductor layer is more heavily doped with an impurity element than the third semiconductor layer.

7. The semiconductor apparatus according to claim 1, wherein the third semiconductor layer is formed of InGaAs.

8. The semiconductor apparatus according to claim 1, further comprising: a first electrode that is connected to the first semiconductor layer, and a second electrode that is connected to the third semiconductor layer;
wherein the first electrode is one electrode of a diode and the second electrode of the other electrode of the diode.

* * * * *